(12) United States Patent
Comulada, Jr. et al.

(10) Patent No.: US 6,595,136 B2
(45) Date of Patent: Jul. 22, 2003

(54) METHOD FOR DISPLACING AN ARTICLE DURING SCREENING

(75) Inventors: Ralph R. Comulada, Jr., Rock Tavern, NY (US); Robert Albert Meyen, Salt Point, NY (US); Keith C. O'Neil, Hughsonville, NY (US); Brenda Lee Peterson, Wappingers Falls, NY (US); Kurt A. Smith, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 09/757,516

(22) Filed: Jan. 10, 2001

(65) Prior Publication Data

US 2002/0090289 A1 Jul. 11, 2002

(51) Int. Cl.[7] .............................. B41F 1/34; B41M 1/12
(52) U.S. Cl. ..................... 101/485; 101/126; 101/129
(58) Field of Search .......................... 101/35, 114, 116, 101/129, 123, 479, 480, 485, 486, 126

(56) References Cited

U.S. PATENT DOCUMENTS

| | | | |
|---|---|---|---|
| 4,362,486 A | | 12/1982 | Davis et al. |
| 5,549,043 A | * | 8/1996 | Tranin .......................... 101/126 |
| 5,740,729 A | * | 4/1998 | Hikita et al. ................. 101/126 |
| 5,887,519 A | * | 3/1999 | Zelko ........................... 101/115 |
| 5,988,059 A | * | 11/1999 | Hamu ........................... 101/114 |
| 6,202,551 B1 | * | 3/2001 | Murakami .................... 101/123 |
| 6,207,220 B1 | * | 3/2001 | Doyle et al. ................... 427/96 |
| 6,289,802 B1 | * | 9/2001 | Zelko ........................... 101/115 |

\* cited by examiner

*Primary Examiner*—Ren Yan
(74) *Attorney, Agent, or Firm*—Ira D. Blecker

(57) ABSTRACT

A method for displacing an article using first and second pallets for holding and transporting an article between two process stations and an H-bar assembly for receiving the first and second pallets, the method including the steps of: receiving the first and second pallets and articles thereon by the H-bar assembly at one of the two process stations; performing a first process on the articles while received by the H-bar assembly; moving the first and second pallets and articles thereon to a second process station; and performing a second process on the articles while at the second process station.

21 Claims, 9 Drawing Sheets

METHOD FOR DISPLACING AN ARTICLE DURING SCREENING

CROSS REFERENCE TO RELATED APPLICATIONS

The present application is related to a patent application entitled "AN APPARATUS FOR DISPLACING AN ARTICLE DURING SCREENING" (Docket No F19-2000-0290US1), Ser. No. 09/757515, filed even date herewith.

BACKGROUND OF THE INVENTION

The present invention relates to screening apparatus for screening of articles and, more particularly, relates to a screening apparatus for screening ceramic greensheets in which the ceramic greensheets may be screened multiple times without losing registration with the screening apparatus.

In the current manufacture of multilayer ceramic (MLC) substrates for integrated circuit semiconductor package structures, a plurality of ceramic sheets is formed by doctor blading a slurry containing a resin binder, a particulate ceramic material, solvents, and a plasticizer, drying the doctor bladed sheet, and blanking it into appropriately sized greensheets. Via holes are then mechanically punched for forming electrical interconnections through the greensheet. Electrically conductive paste is screened in the via holes, and in appropriate patterns on the surface of the greensheets, the greensheets stacked and aminated, and the assembly subsequently fired at an appropriate sintering temperature.

Critical to the manufacturing process is the screening operation since the ceramic greensheets are relatively fragile, their thickness may be on the order of 0.008 inches, and their surface area is relatively large compared to their thickness. As will be appreciated by those skilled in the art, particular problems are encountered when screening such relatively fragile, paper thin, flexible greensheets which are of no concern to the general screen printing art utilizing rigid substrates.

A screening mask is precisely aligned with the greensheet so that when the electrically conductive paste is screened in the via holes and in appropriate patterns on the surface of the greensheets, the screened via holes and patterns are where they are supposed to be.

The screening operations of filling via holes and screening patterns are often done simultaneously, thus the screening paste has to be tailored to satisfy both the via fill and pattern deposition requirements. This approach is not without its problems since the screening paste is a compromise between the differing requirements of via fill and pattern deposition.

An alternative approach is to fill the via holes with a paste Theologically tailored for vias, dismount the greensheet from the screening stage, dry it, remount it on the screening stage, align the greensheet with the screening mask for the patterns, and then screen paste that has been tailored for patterns. This approach presents problems with sheet distortion that occur during the drying process, making greensheet realignment difficult or sometimes impossible for the second screening operation.

Various screening apparatus have been proposed by those skilled in the art. One particular screening apparatus is that disclosed in Davis et al. U.S. Pat. No. 4,362,486, the disclosure of which is incorporated by reference herein. This reference discloses a screening apparatus in which there are two separate loading and screening stations but only one unloading station. Two ceramic greensheets may be loaded and screened at the same time but they must be unloaded alternately as there is only one unload station. To move from one screening station to the other, it is necessary to dismount the greensheet to the unloading station, dry the greensheet, and then remount it at the second screening station.

It would be desirable to be able to move from one screening station without the necessity of dismounting the greensheet and then remounting it.

Accordingly, it is an object of the present invention to have a screening method in which a ceramic greensheet may be moved from one screening station to another without dismounting the ceramic greensheet from the screening stage.

It is another object of the present invention to have a screening method which allows the screening of a paste tailored for the filling of via holes and the screening of a second paste tailored for the deposition of patterns.

It is yet another object of the present invention to have a screening method wherein a ceramic greensheet is displaced from a first position to a second position while remaining in place on a screening stage so that realignment of the ceramic greensheet to the screening stage is unnecessary.

These and other objects of the present invention will become more apparent after referring to the following description of the invention in conjunction with the accompanying drawings.

BRIEF SUMMARY OF THE INVENTION

The purposes of the invention have been achieved by providing, according to a first aspect of the invention, a method for displacing an article using first and second pallets for holding and transporting an article between two process stations and an H-bar assembly for receiving the first and second pallets, the method comprising the steps of:

receiving the first and second pallets and articles thereon by the H-bar assembly at one of the two process stations;

performing a first process on the articles while received by the H-bar assembly;

moving the first and second pallets and articles thereon to a second process station; and performing a second process on the articles while at the second process station.

According to a second aspect of the invention, there is provided a method for displacing an article using first and second pallets for holding and transporting an article from a first position to a second position and a rotatable H-bar assembly for receiving the first and second pallets at the second position, the method comprising the steps of:

moving the first and second pallets and articles thereon from the first position to the second position;

receiving the first and second pallets and articles thereon by the H-bar assembly at the second position;

rotating the H-bar assembly a predetermined amount so as to exchange positions of the first and second pallets and articles thereon; and moving the first and second pallets and articles thereon from the second position at the H-bar assembly to the first position.

According to a third aspect of the invention, there is provided a method for displacing an article during screening using first and second paste screening stations, first and second pallets for holding and transporting an article from a first position at the paste screening station to a second position and a rotatable H-bar assembly for receiving the first and second pallets at the second position, the method comprising the steps of:

screening for the first time the article on each of the pallets with a paste at the first position;

moving the first and second pallets and articles thereon from the first position at the paste screening station to the second position at the H-bar assembly;

receiving the first and second pallets and the articles thereon by the H-bar assembly;

rotating the H-bar assembly a predetermined amount so as to exchange positions of the first and second pallets and the articles thereon;

moving the first and second pallets and the articles thereon from the second position at the H-bar assembly to the first position at the paste screening station; and screening at the paste screening station for the second time the article on each of the pallets with a paste wherein the article on each of the first and second pallets has not been moved with respect to the first and second pallets between the first and second screenings.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 9:
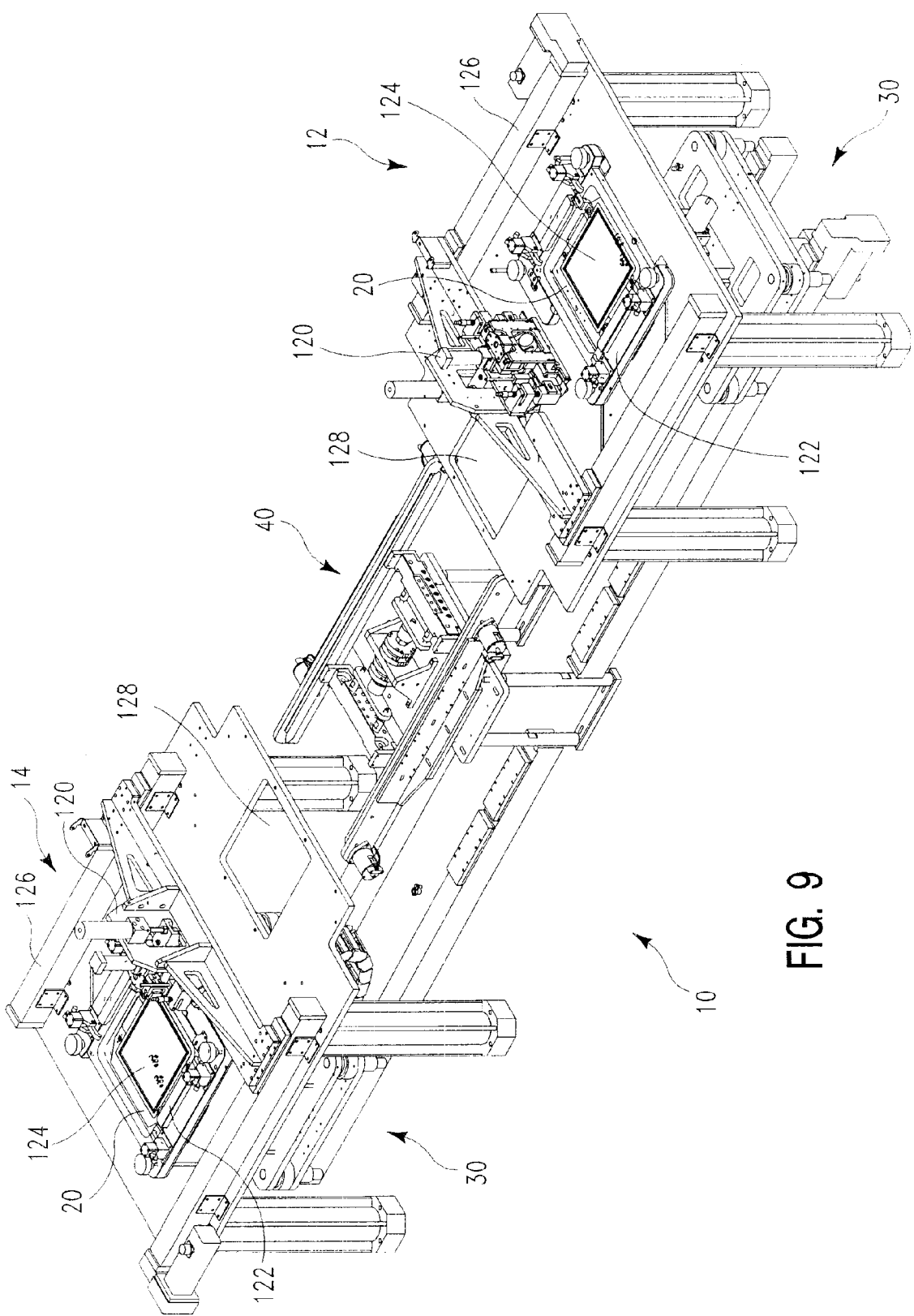
FIG. 9 is a perspective view of screening apparatus useful for practicing the method according to the present invention.

Referring to the Figures in more detail, and particularly referring to FIG. 9, there is shown a perspective view of the screening apparatus 10 useful for practicing the method according to the present invention. One particularly preferred use of the present invention is as screening apparatus for filling via holes in and depositing patterns on ceramic greensheets 124 with a conductive paste. The present invention contemplates at least two screening stations 12, 14 each of which has a paste dispensing assembly 120 and a mask 122. Paste dispensing assembly 120 is moveable along linear actuators 126. The mask 122 shown in the screening stations 12, 14 is a so-called mesh mask. It should be understood that screening stations 12, 14 may also accommodate so-called metal masks. The screening stations 12, 14 also have cutout areas 128 which may be used for optical alignment or other functions. Screening stations 12, 14 are not part of the inventive aspects of the present invention but are shown for completeness. It should be understood that each screening station would have a load and unload station which are not shown for the sake of clarity.

The screening apparatus 10 includes H-bar assembly 40 and pallets 20 which are partially obscured by the screening stations 12, 14. Not shown in FIG. 9 are various apparatus such as cabinets containing electronics, safety shields, racks for moving the mask and the like which are not pertinent to the present invention.

Pallets 20 are shown in FIG. 9 at their most distal points from H-bar assembly 40. The screening apparatus 10 is capable of operating in two modes. In a first mode, a greensheet 124 is first screened at one screening station and then transferred to a second screening station for screening a second time. Thus, after screening a greensheet 124 with mask 122 and a first paste at screening station 12, it is necessary to transfer the greensheet 124 to screening station 14 for screening of a second paste through a second mask 122. The greensheet 124 presently at screening station 14, having already been screened twice, will be unloaded first. Due to the desirability of maintaining registration of the greensheet 124 with the pallet 20 when being transferred from screening station 12 to screening station 14, pallet 20 is transferred to screening station 14 along with the greensheet 124. After unloading the greensheet 124 presently at screening station 14, the pallet 20 at screening station 14 is transferred to screening station 12. The net effect is that pallets 20 at screening stations 12, 14 are swapped. This mutual displacement of pallets 20 is accomplished by H-bar assembly 40.

In a second mode, each side of the screening apparatus 10 operates independently. Thus, a greensheet 124 is loaded onto pallet 20 while pallet 20 is captured by H-bar assembly 40. Pallet 20 is then linearly moved to the screening station 12 or 14, screened and then linearly moved back to H-bar assembly 40 where the greensheet 124 is unloaded. Another greensheet 124 may then be loaded onto pallet 20 to begin the process again.

Figure 1:
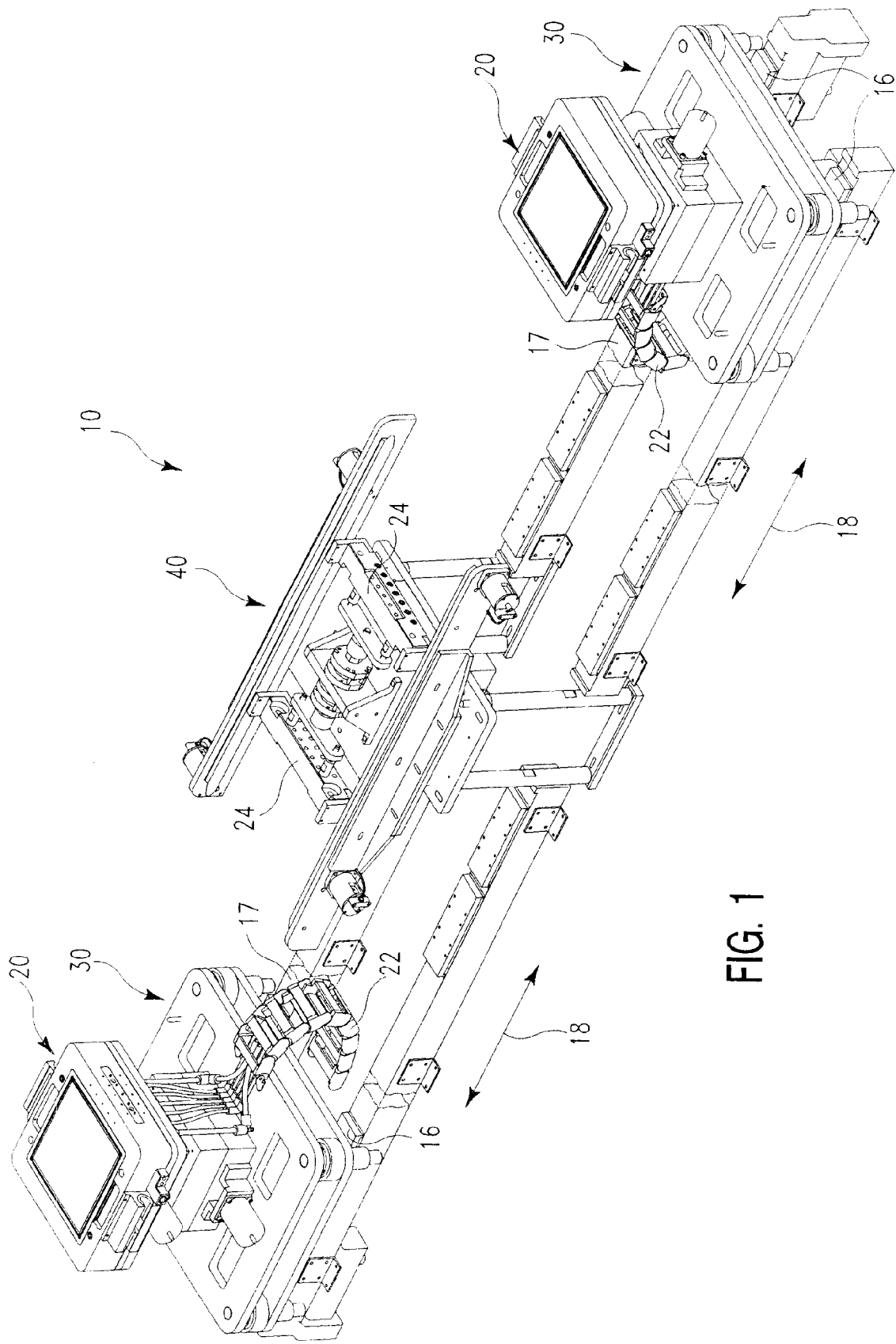
FIG. 1 is a perspective view of the screening apparatus shown in FIG. 9 in a first, screening position with the screening stations removed.
Figure 2:
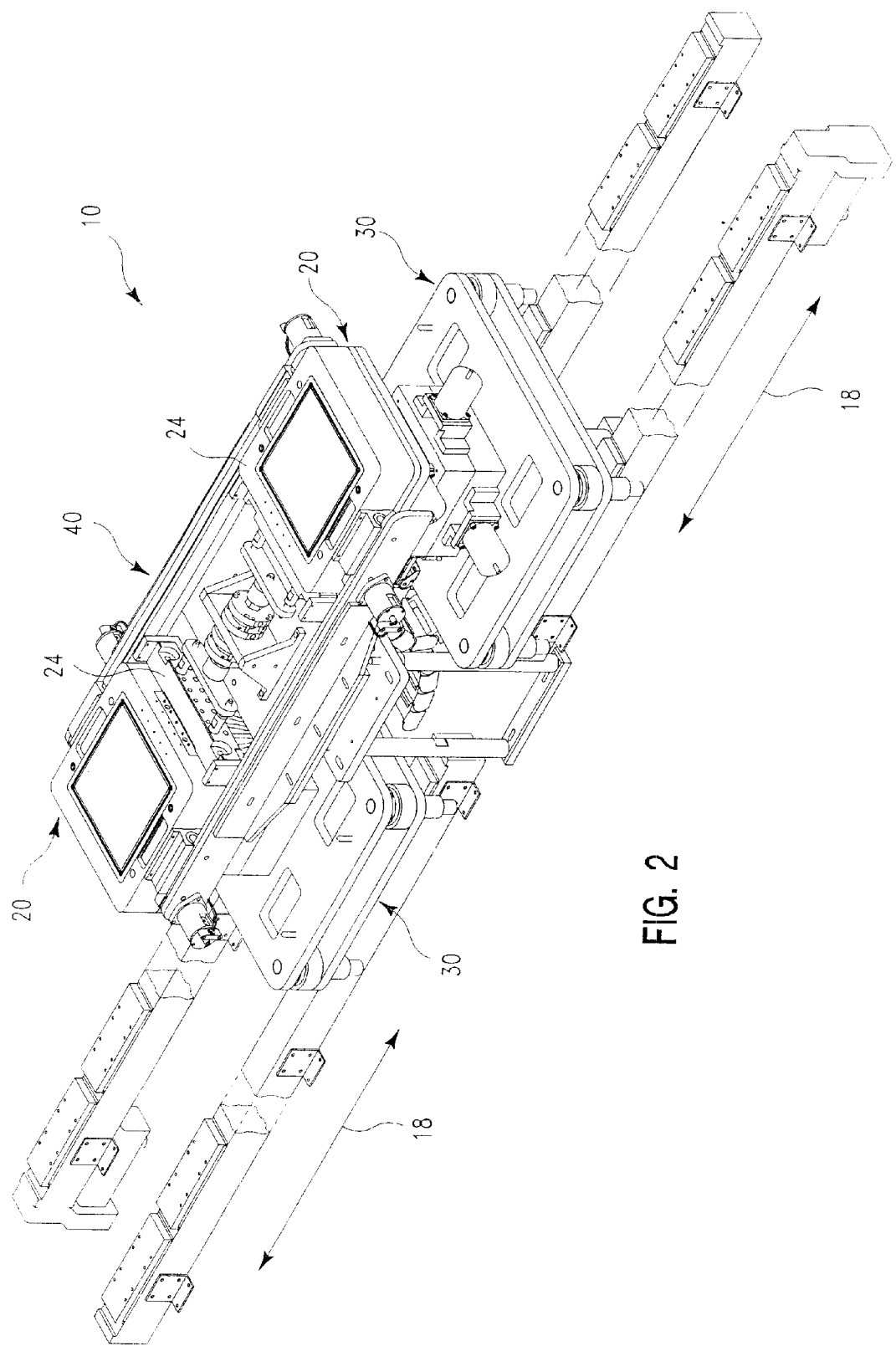
FIG. 2 is a perspective view of the screening apparatus shown in FIG. 1 in a second position.
Figure 3:
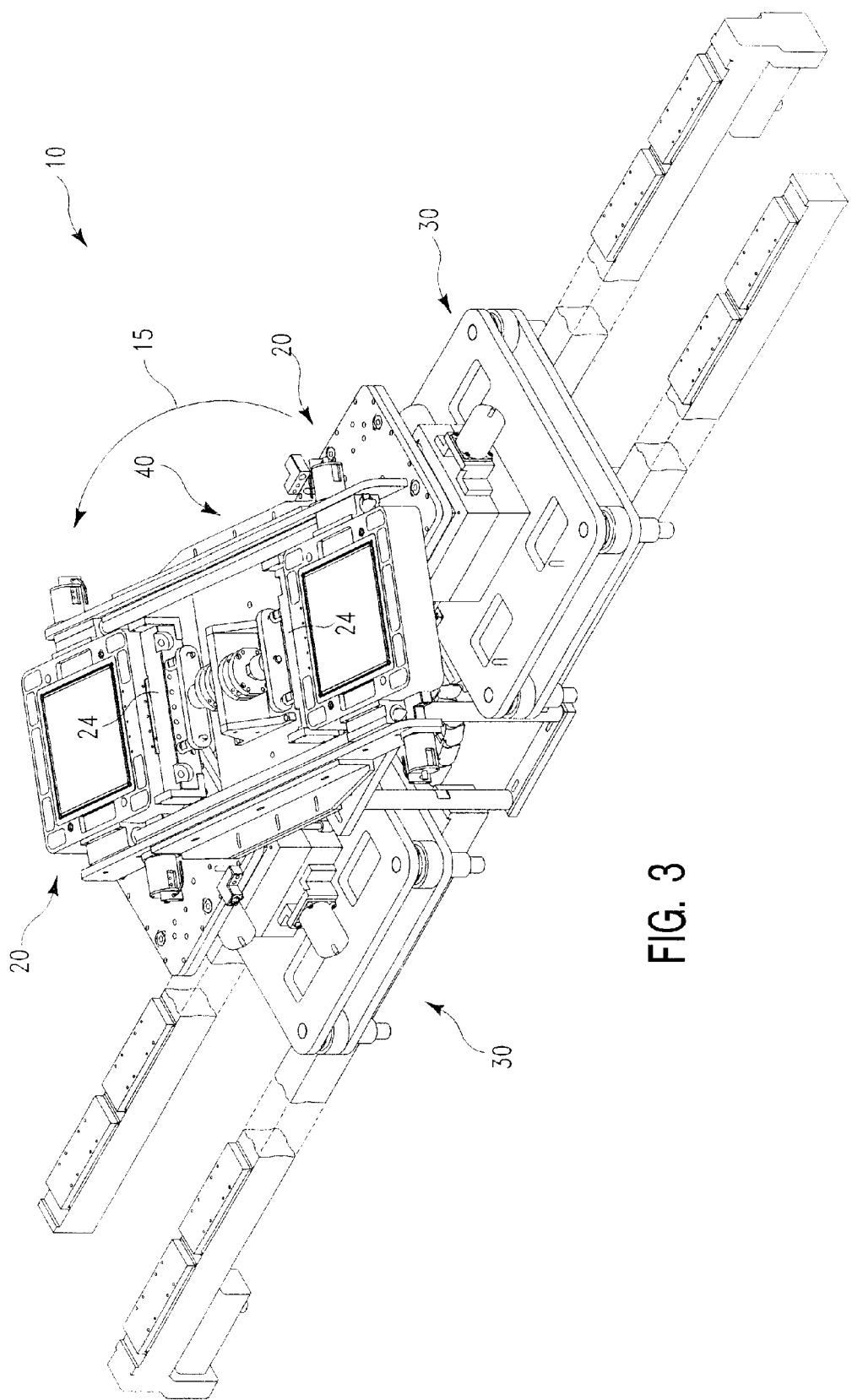
FIG. 3 is a perspective view of the screening apparatus shown in FIG. 2 where the H-bar is rotating with the first and second pallets.

Referring now to FIGS. 1 to 3, the screening apparatus 10 will be described in more detail. The screening apparatus 10 shown in FIGS. 1 to 3 has had the screening stations 12, 14 shown in FIG. 9 removed. As shown in FIG. 1, pallets 20 are at their distal locations with respect to H-bar assembly 40. Pallets 20 are mounted on transfer assemblies 30 which provide air and vacuum to pallets 20 in addition to transporting pallets 20. Transport assemblies 30 are secured to pads 16 which are linked to linear actuators 17. Actuation of linear actuators 17 causes transport assemblies 30 to move back and forth in the directions indicated by arrows 18. Electricity, air and vacuum are provided to transport assemblies 30 and pallets 20 through harness 22.

Referring now to FIG. 2, transport assemblies 30 and pallets 20 have been displaced to be captured by H-bar assembly 40. To accomplish this result, transport assemblies 30 and pallets 20 have been linearly displaced by linear actuators 17 so as to be within the "H" of H-bar assembly 40. Pallets 20 are registered with and locked into position in H-bar assembly 40 by means to be discussed hereafter. Pneumatic blocks 24 then dock with pallets 20.

Pneumatic blocks 24 are a second source of air and vacuum as air and vacuum are also provided to pallets 20 by transport assemblies 30. Air and vacuum are necessary to maintain registration of the greensheets 124 with respect to the pallets 20. If air and vacuum are cut off for an instant, the greensheets 124 on the pallets 20 could lose registration with the pallets 20. Accordingly, air and vacuum need to be continuously maintained while the greensheets 124 are on pallets 20. When control of pallets 20 is passed from transport assemblies 30 to H-bar assembly 40, the control of air and vacuum is also seamlessly transferred from transport assemblies 30 to pneumatic blocks 24.

Thereafter, as shown in FIG. 3, H-bar assembly 40 with pallets 20 is then rotated in the direction indicated by arrow 15 until the positions of the respective pallets 20 have been swapped. At this point, pneumatic blocks 24 undock and pallets 20 are engaged by transport assemblies 30. Transport assemblies 30 and pallets 20 are then linearly displaced by linear actuators 17 to screening stations 12, 14.

It should be understood that docking of the pallets with pneumatic blocks 24 and subsequent rotation of H-bar assembly 40 are only necessary when the screening apparatus 10 is operating in the first mode of the present invention.

Figure 4:
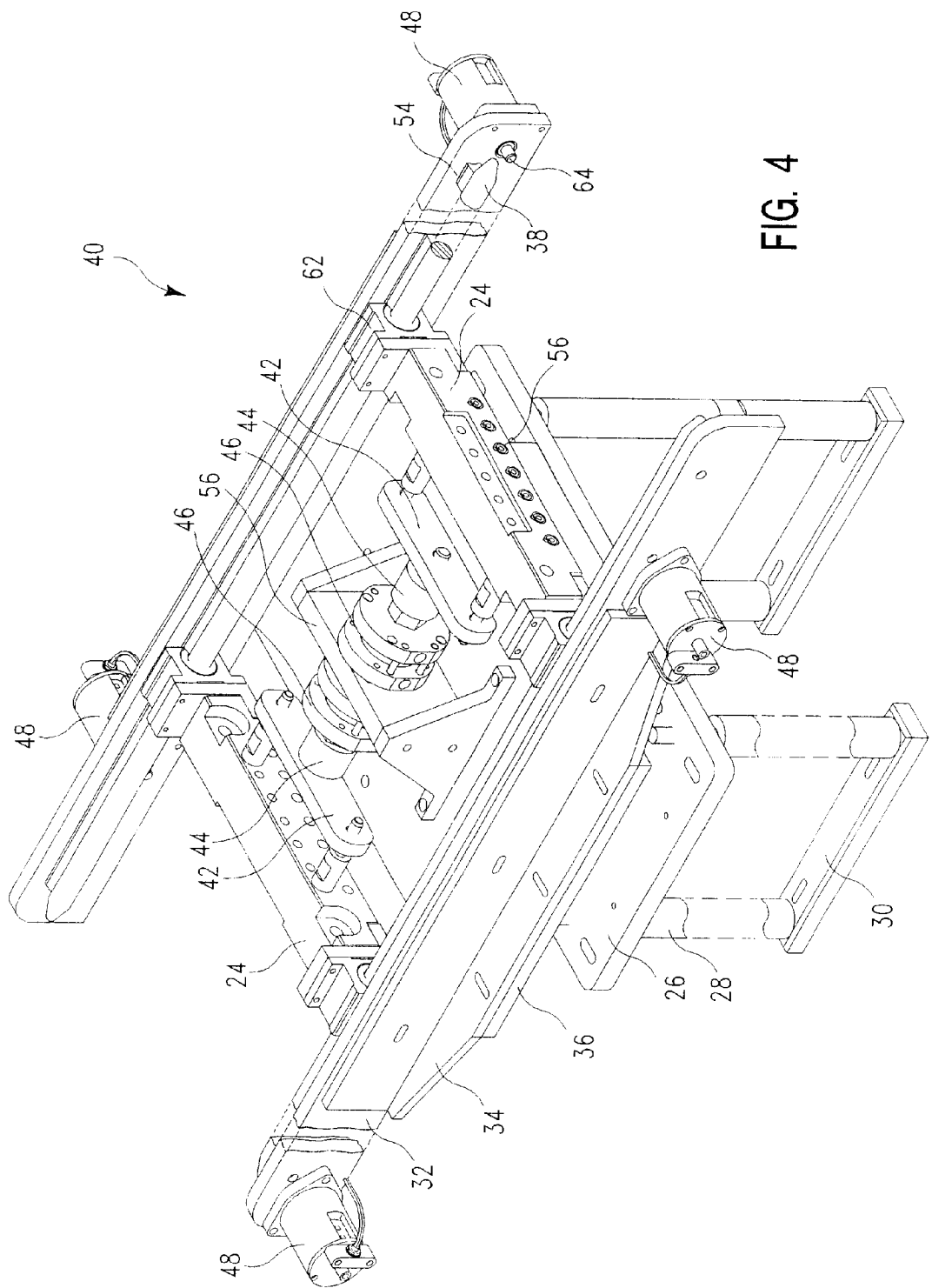
FIG. 4 is an enlarged perspective top view of the H-bar assembly.

Further details of the components of the present invention will now be described with reference to FIGS. 4 through 8. Referring first to FIG. 4, there is shown an enlarged perspective view of the H-bar assembly 40. The H-bar assembly 40 is supported by pedestal plate 26, legs 28 and pedestals 30. The H-bar assembly 40 comprises side plates 32 which are secured to H-bar brackets 34 which in turn are secured to H-bar plate 36. Linear bearings 38 are secured to side plates 32 by support rails 54. Cylinder plate 56 is secured to H-bar plate 36. On either side of cylinder plate 56 are pneumatic block assemblies which slideably move along linear bearings 38.

Each pneumatic block assembly comprises an air cylinder 46 linked to coupler 44 which in turn is secured to push plate 42. Push plate is secured to pneumatic block 24 by standoffs 52. Pneumatic block 24 further includes bearing brackets 62 which allow pneumatic block 24 to slide along linear bearing 38. In operation, pallets 20 are located on linear bearings 38. Air cylinders/switches 48 activate pins 64 which lock pallets 20 into place in the H-bar assembly 40. Then, air cylinders 46 in conjunction with push plates 42 push pneumatic blocks 24 along linear bearings 38. Pneumatic blocks 24 then dock with pallets 20. O-rings 56 denote locations in which air and vacuum are provided to pallets 20 by pneumatic blocks 24. When undocking, travel of pneumatic blocks 24 is reversed by causing air cylinders 46 to pull push plates 42 and pneumatic blocks 24 backwards.

Figure 5:
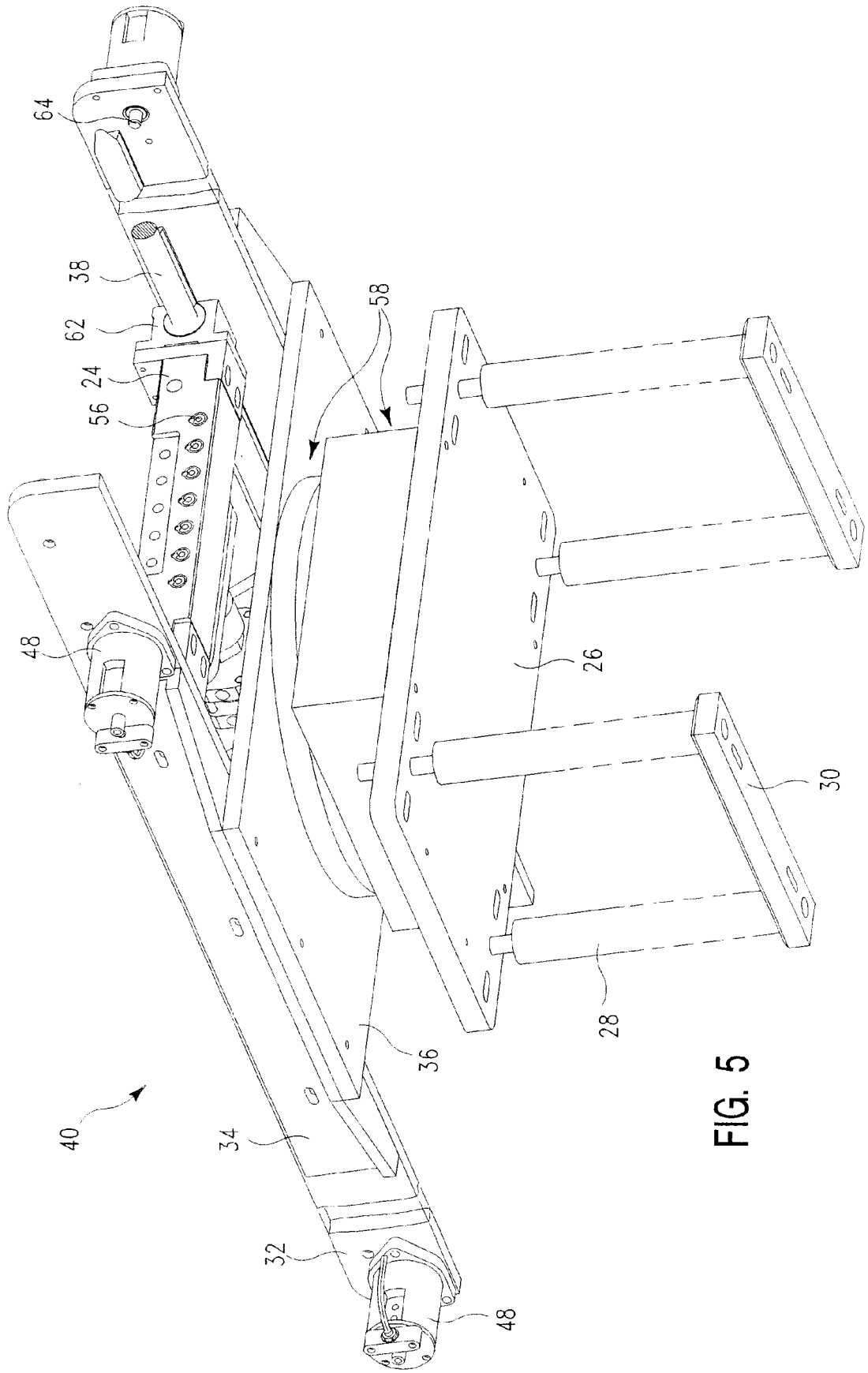
FIG. 5 is an enlarged perspective bottom view of the H-bar assembly.

H-bar assembly 40 is rotatable with respect to pedestal plate 26 by virtue of rotary table 58 located beneath H-bar plate 36. The rotary table 58 is best seen in FIG. 5.

Again, the docking of pneumatic blocks 24 with pallets 20 and rotation of H-bar assembly 40 are only necessary when operating in the first mode of the present invention.

Figure 6:
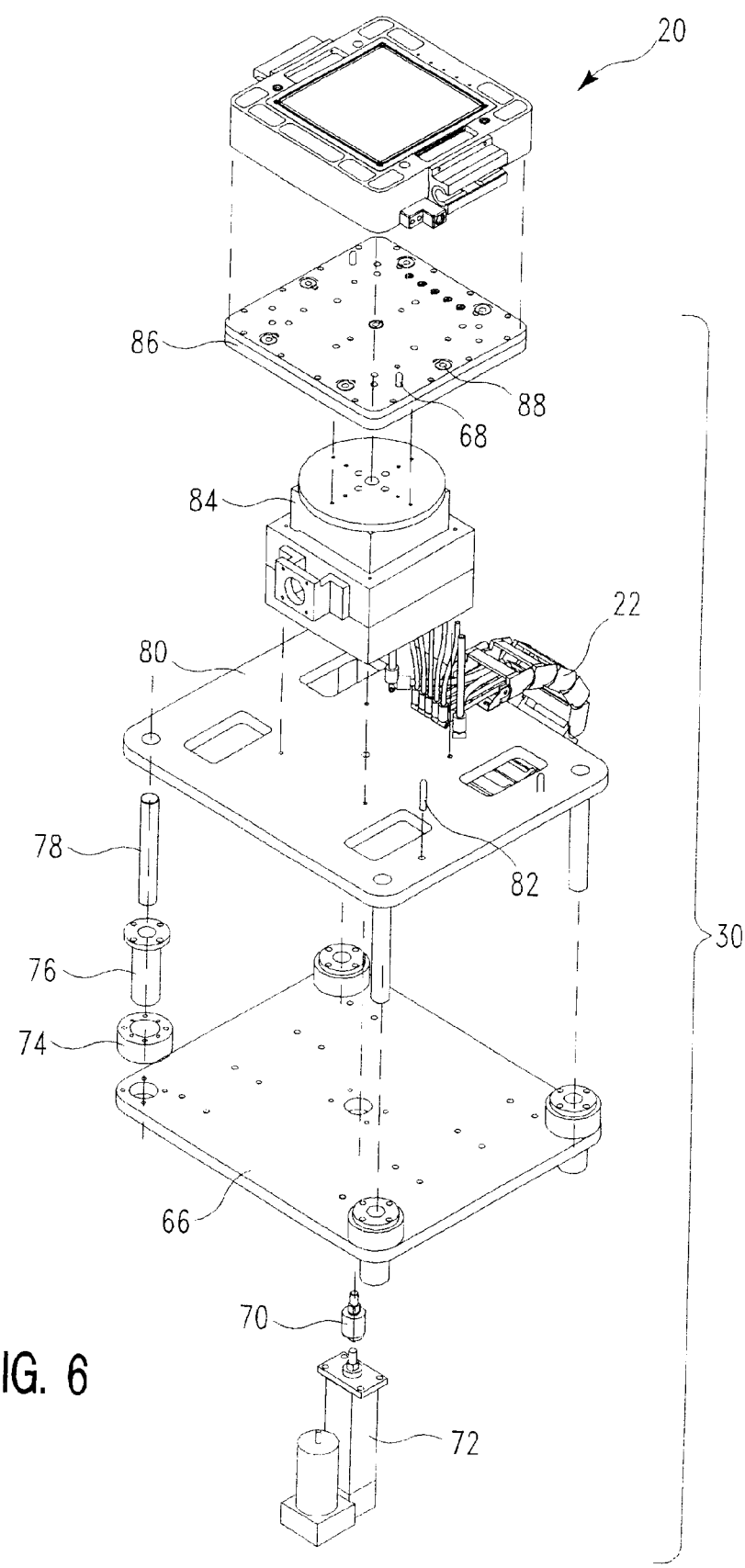
FIG. 6 is an exploded perspective view of one of the pallets and transport assemblies of the apparatus.

Referring now to FIG. 6, a transporter assembly 30 and pallet 20 are shown in more detail. Tran plate 66 supports the transporter assembly 30 and is secured to pads 16 for reciprocal movement by linear actuators 17 (as shown in FIG. 1). Actuator 72 and coupler 70 cooperate to raise and lower stage plate 80. Stage plate 80 is loosely connected to tran plate 66 by shafts 78, alignment bearings 76 and bushings 74. Stage plate 80 has locator pins 82 for registration of stage plate 80 with screening stations 12, 14. Harness 22 and x,y, theta table 84 are secured to the top of stage plate 80. Pallet 20 sits on pallet base 86 which is connected to x,y, theta table 84. Pallet base 86 has locator pins 68 for registering with pallet 20. Air and vacuum from harness 22 are provided to pallet 20 through pallet base 86. When pallet 20 is engaged by H-bar assembly 40, pallet 20 separates from transporter assembly 30 by disengaging from pallet base 86. O-rings 88 are provided on pallet base 86 to provide tight connections between pallet 20 and pallet base 86 for air and vacuum.

Figure 7:
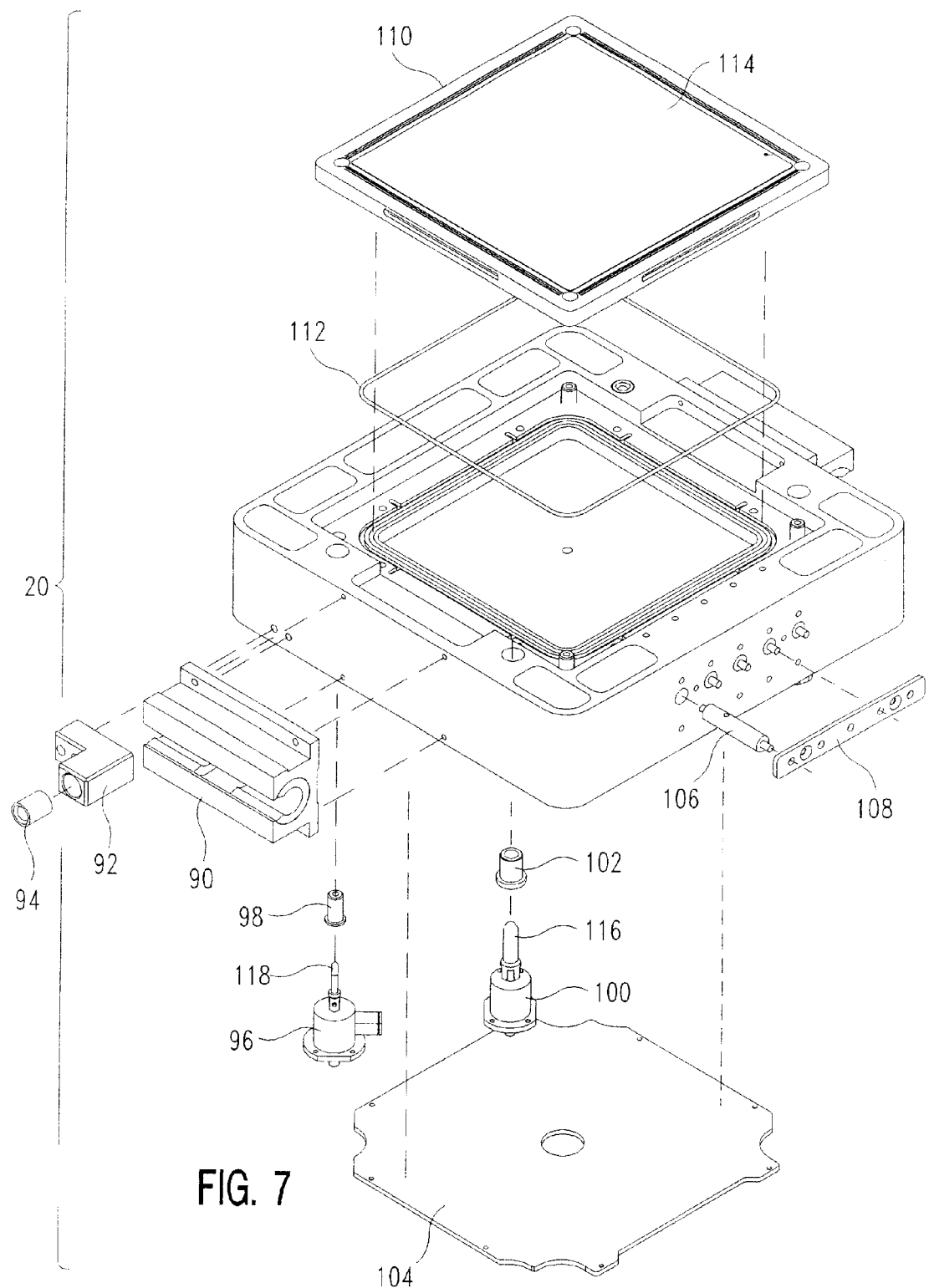
FIG. 7 is an exploded perspective view of one of the pallets.
Figure 8:
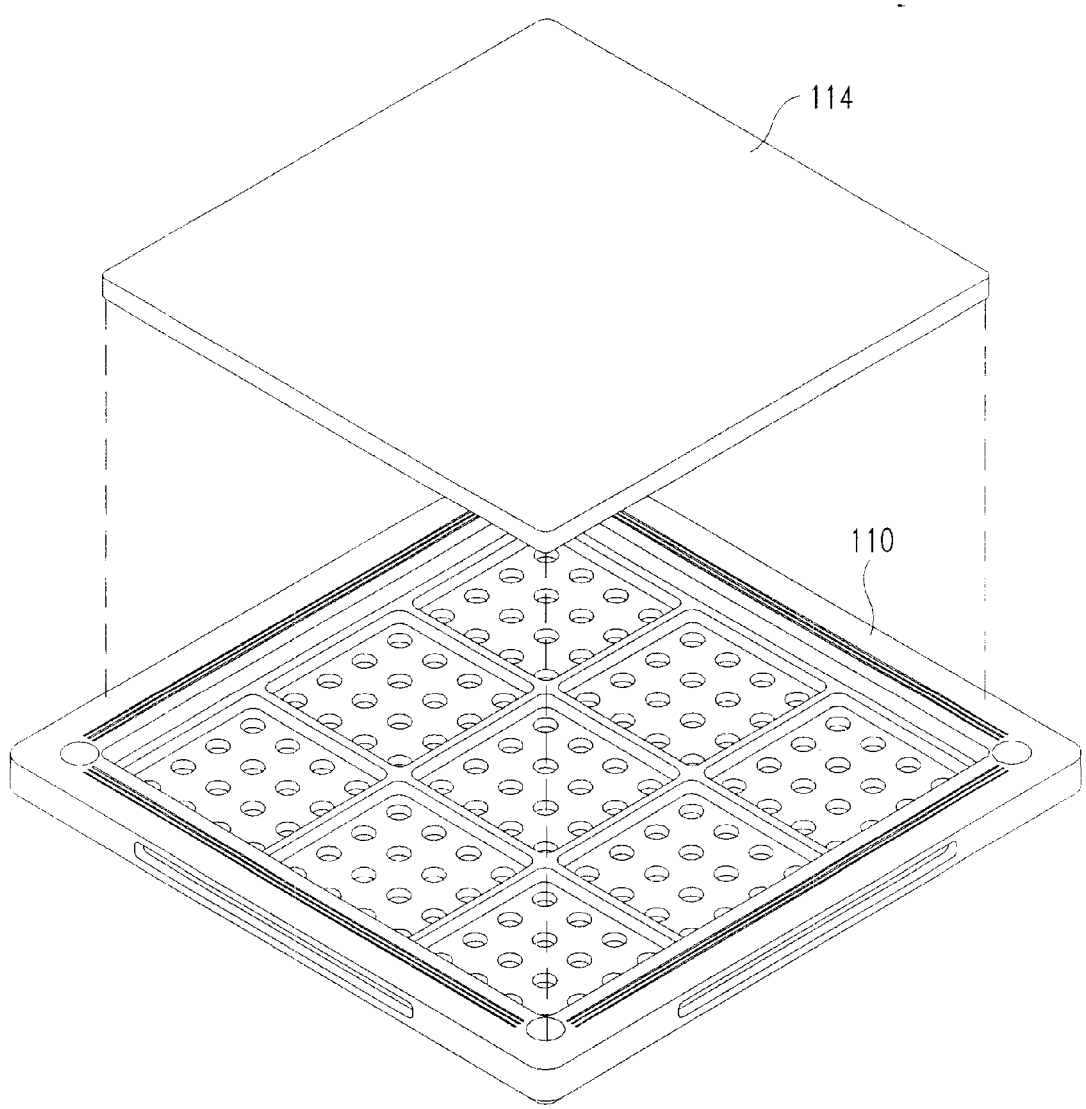
FIG. 8 is an exploded perspective view of a nest to one of the pallets.

The pallet 20 is shown in more detail in FIG. 7. Pallet 20 comprises pillow blocks 90 (one each on opposite sides) secured to pallet 20 which guide pallet 20 along linear bearing 38 of the H-bar assembly 40. Locator blocks 92 (one each on opposite sides) and bushings 94 (one each on opposite sides)are secured to the pallet 20 proximate to the pillow blocks 92 as can be seen assembled in FIG. 6. Underneath the pallet 20 are loca pin cylinder assemblies 96, loca pins 118 and bushings 98, usually four each of them, which provide the location points for the ceramic greensheet 124. Also underneath the pallet 20 are located mask pin cylinder assemblies 100, mask pins 116 and bushings 102, usually two each of them, for location of the mask 122. Cover 104 fits underneath pallet 20.

Air and vacuum are provided to pallet 20 by pneumatic block 24 or transporter assembly 30 through 3-way valves 106 on the side of pallet 20. As will be explained in more detail hereafter, when pneumatic blocks 24 dock with pallets 20, air and vacuum are provided to pallets 20 through valves 106 extending from the sides of pallets 20. On the other hand, when transporter assemblies 30 engage pallets 20, air and vacuum are provided to pallets 20 through passageways on the bottom of pallets 20 which lead to valves 106. The 3-way valves 106 can thus switch between two air and vacuum supplies. While there are five valves 106 shown, two for air and three for vacuum, the number of valves 106 can be changed of course to fit the need of the pallet 20.

Still referring to FIG. 7, valves 106 are held in place by valve plate 108. On top of pallet 20 are located o-ring 112 which provides a seal between the pallet 20 and nest 110. As can be seen best in FIG. 8, nest 110 further includes a porous plate 114, preferably sintered brass or the like. The nest 110 has a number of perforations which allow a vacuum to be pulled through nest 110 and porous plate 114 to firmly hold a greensheet 124 on pallet 20. In operation, the loca pin cylinder assemblies 96 are activated to raise the loca pins 118 so as to accurately locate a greensheet 124 which is held in place on the nest 110 and porous plate 114 by a vacuum. A mask 122 would then be accurately located on the pallet 20 by mask pins 116 of the mask pin assemblies 100.

Detailed Description of the First Mode of Operation of the Screening Apparatus

Referring first to FIG. 9, a greensheet 124 is loaded onto pallet 20 and then moved to screening station 12. The greensheet 124 is located by loca pins 116 (as shown in FIG. 7) and held in place by a vacuum pulled through nest plate 110 (as shown in FIG. 7). Loca pins 116 can now be retracted to provide a flat surface for mask and screening operations. A mask 122 is then placed on pallet 20 and is located by mask pins 116 (as shown in FIG. 7). Since pallet 20 at screening station 14 already has a greensheet 124 in place, it is only necessary to locate a mask 122 by a similar manner on this pallet 20.

Screening stations 12, 14 are activated, preferably simultaneously, to screen patterns or fill via holes as desired on the greensheets 124 at these two screening stations 12, 14. The mask pins 116 are lowered and the masks 122 are removed. At this point in the operation of the screening apparatus 10, the greensheet 124 located at screening station 14 is preferably unloaded because it has already been screened twice.

Referring now to FIG. 2, the transport assemblies 30 transporting pallets 20 are translated by linear actuators 17 to the H-bar assembly 40. Linear bearings 38 (FIG. 4) engage pillow blocks 92 (FIG. 7) of the pallets 20 so as to guide the pallets 20 within the H-bar assembly 40. After the pallets 20 are properly located within H-bar assembly 40, the transporter assembly 30 stops moving. Air cylinders/switches 48 activate pins 64 (FIG. 4) to lock the pallets 20 in place. As best seen in FIG. 4, air cylinders 46 on the H-bar assembly 40 are activated to push pneumatic blocks 24 into docking engagement with pallets 20. At the precise moment that air and vacuum are provided to pallets 20 through valves 106 by pneumatic blocks 24, air and vacuum provided by the transport assembly is shut off to pallets 20.

Referring now to FIG. 6, actuators 72 through stage plates 80 cause pallet bases 86 to be lowered to disengage from pallets 20. Pallets 20 have now been completely transferred to the control of H-bar assembly 40. As can be appreciated, air provided to loca pins 118 to locate the greensheets 124 and vaccum provided to nest plate 110 to hold down the greensheets 124 are never shut off with respect to pallets 20 during the transfer of the pallets 20 to H-bar assembly 40.

Referring now to FIG. 3, H-bar assembly 40 rotates 180° so as to swap the position of pallets 20 so that the pallet 20 having the greensheet 124 screened at screening station 12 has now been displaced so that it can be transported to screening station 14 for a second screening. Similarly, the pallet 20 previously at screening station 14 has had its greensheet 124 unloaded and is displaced so as to receive a new greensheet 124 for screening a first time at screening station 12.

The procedure described above is now reversed. Referring to FIG. 6, actuators 72 of transport assemblies 30 are activated to raise pallet bases 86 into contact with pallets 20. At the precise moment that air and vacuum are provided to pallets 20 by transporter assemblies 30, valves 106 are switched so that air and vacuum from pneumatic blocks 24 are shut off from pallets 20.

Again referring to FIG. 4, air cylinders/switches 48 are disengaged so that pins 64 are withdrawn, thereby releasing pallets 20 from H-bar assembly 40. Transport assemblies and pallets 20 may now be translated by linear actuators 17 to the distal positions shown in FIG. 1.

The process according to the present invention is now ready to start over.

Detailed Description of the Second Mode of Operation of the Screening Apparatus

Referring first to FIG. 2, the second mode of operation begins with the pallets 20 captured by H-bar assembly 40. Greensheets 124 are loaded onto pallets 20. Transporter assemblies 30 transport pallets 20 to screening stations 12, 14 as shown in FIGS. 1 and 9. Masks 122 are placed on pallets 20 and are located by mask pins 116 (as shown in FIG. 7). Screening stations 12, 14 are activated to screen patterns or fill via holes as desired on the greensheets 124.

Screening apparatus 10 has been designed by the present inventors so that each side of the screening apparatus (comprising linear actuators 17, transporter assembly 30, pallet 20, screener 12 or 14, and half of H-bar assembly 40) can operate independently of the other side or simultaneously with it.

After screening, the mask pins 116 are lowered and the masks 122 removed. Thereafter, the transport assemblies 30 transporting pallets 20 are translated by linear actuators 17 to the H-bar assembly 40.

Referring now to FIG. 2, the transport assemblies 30 transporting pallets 20 are translated by linear actuators 17 to the H-bar assembly 40. Linear bearings 38 (FIG. 4) engage pillow blocks 92 (FIG. 7) of the pallets 20 so as to guide the pallets 20 within the H-bar assembly 40. After the pallets 20 are properly located within H-bar assembly 40, the transporter assembly 30 stops moving. Optionally, air cylinders/switches 48 may activate pins 64 (FIG. 4) to lock the pallets 20 in place.

Screened greensheets 124 are unloaded and new or previously screened greensheets are loaded onto pallet 20 and the process begins again.

It should be understood that the preferred embodiments of the present invention have been described above with reference to a screening apparatus. It can be appreciated that the present invention may have utility for other thin, flexible articles besides ceramic greensheets. Further, while the preferred embodiment of the present invention comprises two pallets and transporter assemblies such that when swapping the two pallets the H-bar assembly rotates 180°, it can be appreciated that there may be more than two transporter assemblies and pallets. Further, the screening apparatus may be configured such that the H-bar assembly rotates more or less than 180°.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for displacing an article using first and second pallets each for holding and transporting an article from a first position to a second position and a rotatable H-bar assembly for receiving the first and second pallets at the second position, the method comprising the steps of:

moving the first and second pallets and articles thereon from the first position to the second position;

receiving simultaneously the first and second pallets and articles thereon by the H-bar assembly at the second position;

rotating the H-bar assembly a predetermined amount so as to exchange positions of the first and second pallets and articles thereon;

separating the first and second pallets and articles thereon from the H-bar assembly; and moving the first and second pallets and articles thereon from the second position at the H-bar assembly to the first position.

2. The method of claim 1 wherein the step of receiving comprises docking the first and second pallets with the H-bar assembly.

3. The method of claim 1 wherein the step of rotating the H-bar assembly comprises rotating the H-bar assembly 180 degrees after receiving the first and second pallets.

4. The method of claim 1 further comprising the step after receiving the first and second pallets of locking each of the pallets in place after they are received by the H-bar assembly.

5. A method for displacing an article using first and second pallets each for holding and transporting an article between two process stations and an H-bar assembly for receiving the first and second pallets, the method comprising the steps of:

receiving simultaneously the first and second pallets and articles thereon by the H-bar assembly at one of the two process stations;

performing a first process on the articles while received simultaneously by the H-bar assembly;

separating the first and second pallets and articles thereon from the H-bar assembly;

moving the first and second pallets and articles thereon to a second process station; and performing a second process on the articles while at the second process station.

6. The method of claim 1 further comprising first and second transport assemblies for transporting the first and second pallets.

7. The method of claim 1 wherein in the steps of performing first and second processes on the articles, the first and second processes performed on the article on the first pallet are synchronized so as to occur simultaneously with the first and second processes performed on the article on the second pallet.

8. The method of claim 1 wherein in the steps of performing first and second processes on the articles, the first and second processes performed on the article on the first pallet occur independently with respect to the first and second processes performed on the article on the second pallet.

9. The method of claim 1 wherein the articles are ceramic greensheets.

10. The method of claim 1 wherein the article is displaced during a screening process and wherein the method further comprising the steps of:

returning the first and second pallets and articles thereon to the H-bar assembly;

receiving the first and second pallets and articles thereon by the H-bar assembly; and performing a third process on the article while received by the H-bar assembly.

11. The method of claim 10 wherein the first process comprises loading an article on each of the first and second pallets.

12. The method of claim 10 wherein the second process comprises screening a paste on the articles.

13. The method of claim 10 wherein the third process comprises unloading an article from each of the first and second pallets.

14. A method for displacing an article using first and second pallets for holding and transporting an article from a first position to a second position and a rotatable H-bar assembly for receiving the first and second pallets at the second position, the method comprising the steps of:

moving the first and second pallets and articles thereon from the first position to the second position;

receiving the first and second pallets and articles thereon by the H-bar assembly at the second position;

rotating the H-bar assembly a predetermined amount so as to exchange positions of the first and second pallets and articles thereon;

moving the first and second pallets and articles thereon from the second position at the H-bar assembly to the first position; and further comprising first and second transport assemblies for transporting the first and second pallets wherein the first and second pallets are separable from the first and second transport assemblies, respectively, and further comprising the step, after receiving of separating the first and second transport assemblies from their respective first and second pallets.

15. The method of claim 10 wherein the articles are ceramic greensheets.

16. A method for displacing an article during screening using first and second paste screening stations, first and second pallets each for holding and transporting an article from a first position at the paste screening station to a second position and a rotatable H-bar assembly for receiving the first and second pallets at the second position, the method comprising the steps of:

screening for the first time the article on each of the pallets with a paste at the first position;

moving the first and second pallets and articles thereon from the first position at the paste screening station to the second position at the H-bar assembly;

receiving simultaneously the first and second pallets and the articles thereon by the H-bar assembly;

rotating the H-bar assembly a predetermined amount so as to exchange positions of the first and second pallets and the articles thereon;

separating the first and second pallets and articles thereon from the H-bar assembly;

moving the first and second pallets and the articles thereon from the second position at the H-bar assembly to the first position at the paste screening station; and screening at the paste screening station for the second time the article on each of the pallets with a paste wherein the article on each of the first and second pallets has not been moved with respect to the first and second pallets between the first and second screenings.

17. The method of claim 16 wherein the step of receiving comprises docking the first and second pallets with the H-bar assembly.

18. The method of claim 16 wherein the step of rotating the H-bar assembly comprises rotating the H-bar assembly 180 degrees after receiving the first and second pallets.

19. The method of claim 16 further comprising the step after receiving the first and second pallets of locking each of the pallets in place after they are received by the H-bar assembly.

20. A method for displacing an article during screening using first and second paste screening stations, first and second pallets for holding and transporting an article from a first position at the paste screening station to a second position and a rotatable H-bar assembly for receiving the first and second pallets at the second position, the method comprising the steps of:

screening for the first time the article on each of the pallets with a paste at the first position;

moving the first and second pallets and articles thereon from the first position at the paste screening station to the second position at the H-bar assembly;

receiving the first and second pallets and the articles thereon by the H-bar assembly;

rotating the H-bar assembly a predetermined amount so as to exchange positions of the first and second pallets and the articles thereon;

moving the first and second pallets and the articles thereon from the second position at the H-bar assembly to the first position at the paste screening station;

screening at the paste screening station for the second time the article on each of the pallets with a paste wherein the article on each of the first and second pallets has not been moved with respect to the first and second pallets between the first and second screenings; and further comprising first and second transport assemblies for transporting the first and second pallets wherein the first and second pallets are separable from the first and second transport assemblies, respectively, and further comprising the step, after receiving of separating the first and second transport assemblies from their respective first and second pallets.

21. The method of claim 16 wherein the article is a ceramic greensheet.

* * * * *